United States Patent
Yamasaki et al.

(10) Patent No.: US 7,078,269 B2
(45) Date of Patent: Jul. 18, 2006

(54) SUBSTRATE FABRICATION METHOD AND SUBSTRATE

(75) Inventors: Tomoo Yamasaki, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 97 days.

(21) Appl. No.: 10/776,864

(22) Filed: Feb. 10, 2004

(65) Prior Publication Data

US 2004/0180540 A1  Sep. 16, 2004

(30) Foreign Application Priority Data

Mar. 5, 2003  (JP) ............................. 2003-058999

(51) Int. Cl.
*H01L 21/58* (2006.01)
(52) U.S. Cl. ........................ 438/121; 439/55
(58) Field of Classification Search ................ 438/106, 438/121; 257/774, 21.484; 439/55, 58
See application file for complete search history.

(56) References Cited

U.S. PATENT DOCUMENTS 6,608,371 B1 *  8/2003  Kurashima et al. ......... 257/686

2004/0040739 A1 *  3/2004  Yoshimura et al. ......... 174/255
2004/0212030 A1 * 10/2004  Asai ............................ 257/432

FOREIGN PATENT DOCUMENTS

| JP | 2001-053218 | 2/2001 |
| JP | 2001-274034 | * 10/2001 |
| JP | 2002-008942 | 1/2002 |

* cited by examiner

*Primary Examiner*—W. David Coleman
(74) *Attorney, Agent, or Firm*—Ladas & Parry LLP

(57) ABSTRACT

An efficient substrate fabrication method is disclosed. A method of fabricating a substrate having a via terminal includes the steps of: forming a concave part on a front surface of a source substrate; forming a front surface side conductive part by filling the concave part with a conductor; forming the core substrate by back-grinding up to a position immediately before the front surface side conductive part is exposed such that a tip of the front surface side conductive part is covered with a portion of the core substrate; exposing the tip of the front surface side conductive part by forming a concave part in a rear surface of the core substrate; forming a rear surface side conductive part by filling the concave part with a conductor; and electrically and mechanically connecting the front surface side conductive part with the rear surface side conductive part.

6 Claims, 12 Drawing Sheets

SUBSTRATE FABRICATION METHOD AND SUBSTRATE

BACKGROUND OF THE INVENTION

1. Field of the Invention

The present invention relates to a substrate fabrication method and a substrate.

2. Description of the Related Art

Recently, semiconductor devices tend to include semiconductor elements of which operating frequencies are higher. As a result, there is a stronger demand of stabilizing source voltages supplied to such semiconductor elements. For such a semiconductor device having semiconductor elements operating at high frequencies, a variety of substrate structures having embedded capacitor elements have been presented as disclosed in Japanese Laid-Open Patent Applications No. 2002-008942 and No. 2001-053218.

In an exemplary presented substrate structure, a capacitor element includes a capacitor part on a silicon substrate and a via terminal to pierce the silicon substrate.

FIG. 1A through 1D are diagrams to explain conventional steps of fabricating such a capacitor element.

A capacitor element 1 is fabricated by following fabrication steps as shown in FIGS. 1A through 1D. At the first step, concave parts 3, which are used to form via terminals, are formed on the front surface 2a of a thick silicon substrate 2 having a thickness t1, as illustrated in FIG. 1A. At the second step, an insulation film 9 is formed on the front surface 2a, and then Cu is plated on the insulation film 9. As a result, the interiors of the concave parts 3 are filled with Cu, resulting in conductive parts 4 as illustrated in FIG. 1B. In the third step, a capacitor part 5 is formed on the surface 2a of the thick silicon substrate 2, for example, through etching and anodization, as illustrated in FIG. 1C. In the fourth step, in order to expose the conductive parts 4, the silicon substrate 2 is grinded up to the line 15 from the rear surface 2b by using a grindstone (back-grinding). Such a fabricated capacitor element 1 includes a silicon substrate 10 and a via terminal 11 as illustrated in FIG. 1D.

As mentioned above, however, one surface of a substrate is back-grinded with a grindstone until the conductive parts 4 are exposed. As a result, Cu powder may arise from the Cu conductive parts 4 through the back-grinding, resulting in clogging the grindstone surface. Thus, there occurs a problem of complicating grindstone maintenance.

In addition, since such Cu powder scatters at a high speed in general, there is a risk that work environments for semiconductor device fabrication may be contaminated.

SUMMARY OF THE INVENTION

It is a general object of the present invention to provide a substrate fabrication method and a substrate in which the above-mentioned problems are eliminated.

A more specific object of the present invention is to provide a substrate fabrication method in which a substrate having a via terminal can be efficiently fabricated without generating harmful powder grinded from the surfaces of conductive parts.

In order to achieve the above-mentioned objects, there is provided according to one aspect of the present invention a method of fabricating a substrate having a via terminal from a source substrate by piercing a conductive part through a core substrate of the substrate, the method including the steps of: forming a concave part on a front surface of a source substrate thicker than the core substrate; forming a front surface side conductive part by filling the concave part in the front surface with a conductor; forming the core substrate by grinding the source substrate from a rear surface of the source substrate up to a position immediately before the front surface side conductive part is exposed such that a tip of the front surface side conductive part is covered with a portion of the core substrate; exposing the tip of the front surface side conductive part by forming a concave part in a rear surface of the core substrate; forming a rear surface side conductive part by filling the concave part in the rear surface with a conductor; and electrically and mechanically connecting the front surface side conductive part with the rear surface side conductive part to form the via terminal.

In an embodiment of the present invention, the method may further include the step of forming an insulation film on a surface of the source substrate including an inner surface of the concave part on the front surface of the source substrate after the step of forming the concave part in the front surface of the source substrate thicker than the core substrate before the step of forming the front surface side conductive part by filling the concave part on the front surface with the conductor.

In an embodiment of the present invention, the source substrate may be one of a silicon substrate, a glass substrate and a ceramic substrate.

Additionally, there is provided according to another aspect of the present invention a substrate having a core substrate, including: a via terminal being formed to pierce the core substrate, wherein the via terminal is configured by electrically and mechanically connecting a front surface side conductive part of the core substrate with a rear surface side conductive part of the core substrate at a thickness directional position of the core substrate, the front surface side conductive part is formed by filling a concave part in a rear surface of the core substrate with a conductor, and the rear surface side conductive part is formed by filling a concave part on a front surface of the core substrate with a conductor.

Additionally, there is provided according to another aspect of the present invention a method of fabricating a semiconductor device substrate for mounting a semiconductor element wherein the semiconductor device substrate includes at least one external connection terminal and a capacitor element, the at least one external connection terminal is provided on a rear surface of the semiconductor device substrate, and the capacitor element includes a core substrate and a capacitor part formed on a front surface of the core substrate by sandwiching an electrode between dielectric layers, the method including the steps of: forming a capacitor element in such a way that a front surface side concave part in a front surface of the core substrate is filled with a conductor and the core substrate is grinded from a rear surface thereof up to a position where the front surface side conductive part is not exposed; turning over the formed capacitor element and mounting the resulting capacitor element on the semiconductor device substrate; forming an insulation layer on a front surface of the mounted capacitor element; forming a concave part to pierce through the insulation layer toward the front surface side concave part by grinding the core substrate from the rear surface thereof; forming a rear surface side conductive part by filling the formed concave part in the rear surface of the core substrate with a conductor and electrically and mechanically connecting the rear surface side conductive part with the front surface side conductive part at a thickness directional position of the core substrate in order to form a via terminal; and forming an insulation layer on an upper surface of the resulting core substrate, forming a hole to pierce the insulation layer, filling the hole with a conductor, and forming a conductive path electrically and mechanically connected to the via terminal.

In an embodiment of the present invention, the step of forming the capacitor element may form an insulation film on an inner surface of the front surface side concave part and fill the front surface side concave part with a conductor.

According to one aspect of the present invention, since back-grinding of a source substrate is halted until a front surface side conductive part of the substrate is exposed. As a result, it is possible to efficiently a substrate having a via terminal without generating powder grinded from the front surface side conductive part and clogging a grindstone. In addition, it is possible to prevent scattering of such powder and contamination of working environments of the semiconductor device fabrication.

Other objects, features and advantages of the present invention will become more apparent from the following detailed description when read in conjunction with the accompanying drawings.

DETAILED DESCRIPTION OF THE PREFERRED EMBODIMENTS

In the following, embodiments of the present invention will be described with reference to the accompanying drawings.

Figure 1A:
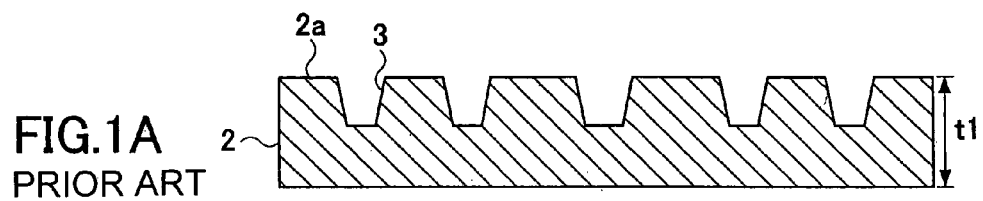
FIG. 1A through 1D are diagrams to explain conventional steps of fabricating a capacitor element having a via terminal.
Figure 1B:
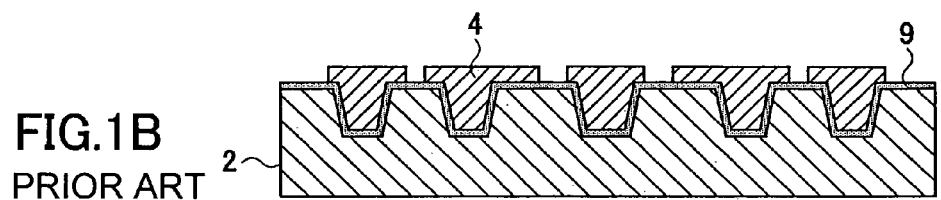
Figure 1C:
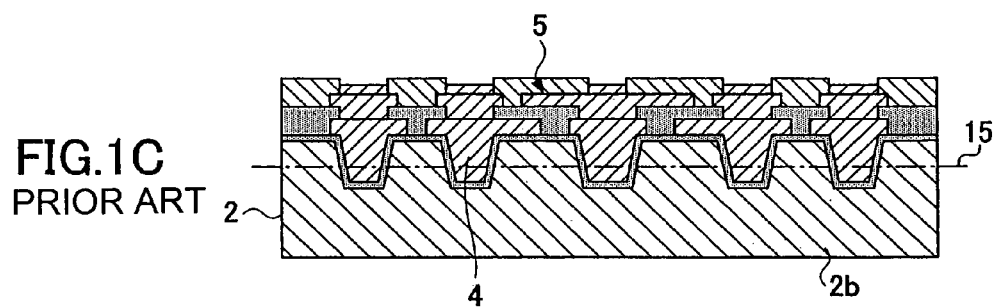
Figure 1D:
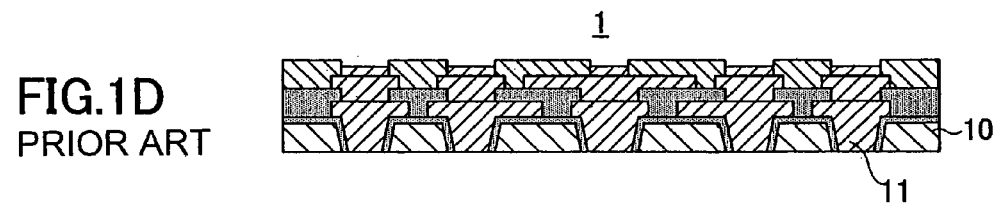
Figure 2:
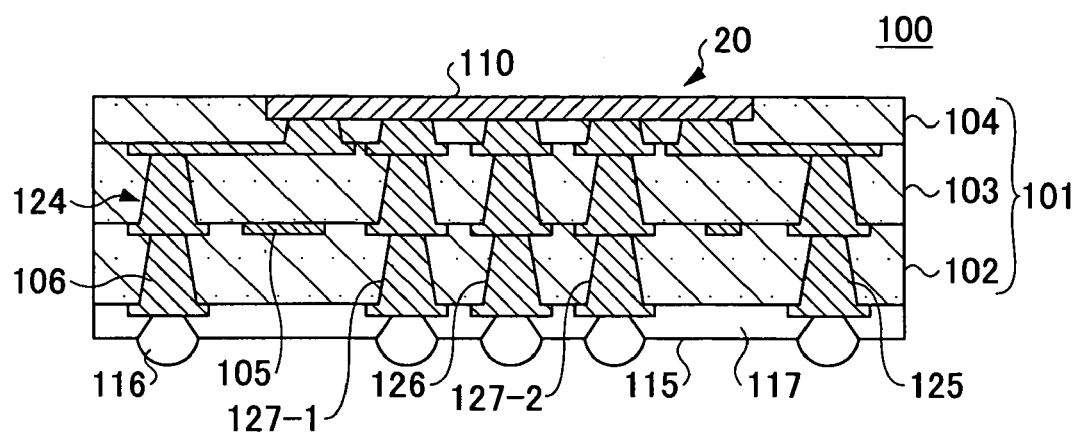
FIG. 2 is a cross-sectional view of a semiconductor device substrate according to an embodiment of the present invention.
Figure 3A:
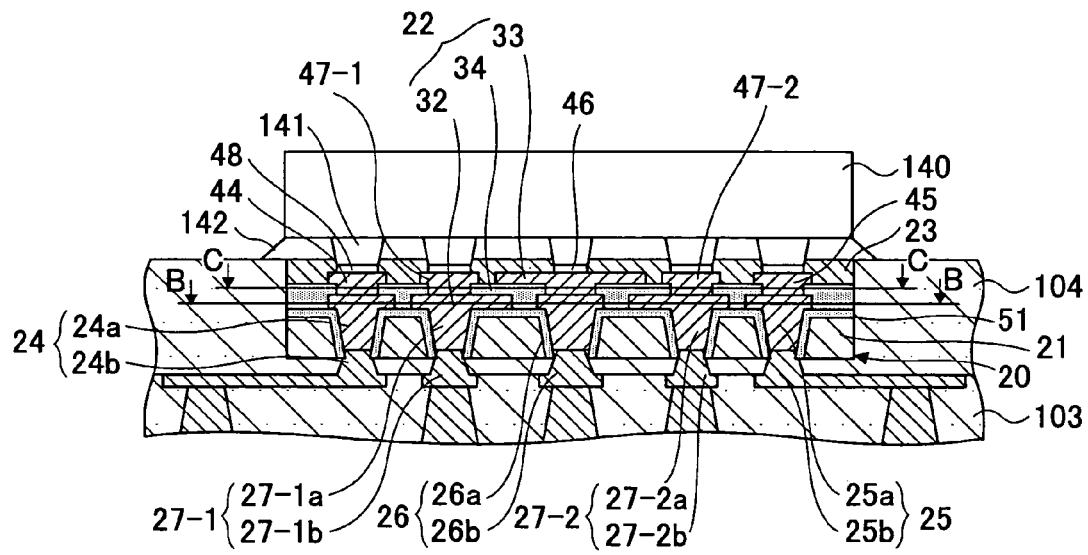
FIG. 3A is an enlarged view of a portion of the semiconductor device substrate shown in FIG. 2.
Figure 3B:
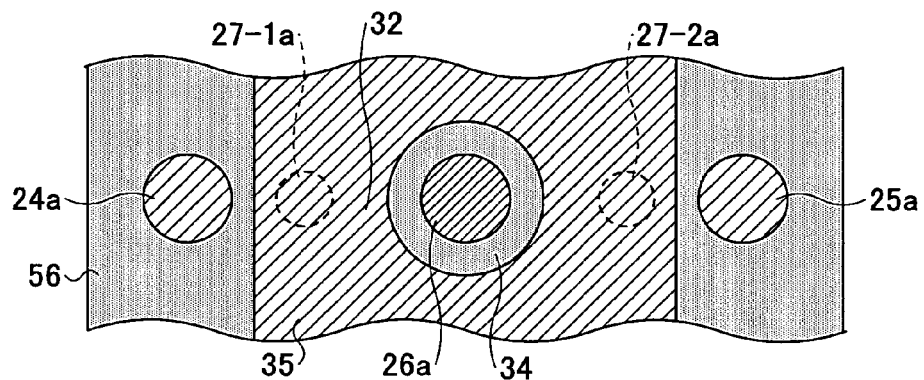
FIGS. 3B and 3C are cross-sectional views of the semiconductor device substrate with respect to a BB plane and a CC plane, respectively, illustrated in FIG. 3A.
Figure 3C:
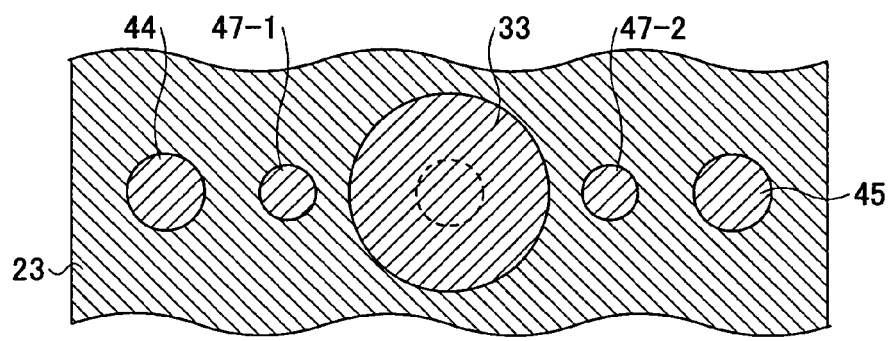

FIG. 2 is a cross-sectional view of a semiconductor device substrate 100 according to an embodiment of the present invention. FIG. 3A is an enlarged view of a portion of the semiconductor device substrate 100 shown in FIG. 2. FIGS. 3B and 3C are cross-sectional views of the semiconductor device substrate 100 with respect to the BB plane and the CC plane, respectively, illustrated in FIG. 3A.

Figure 5:
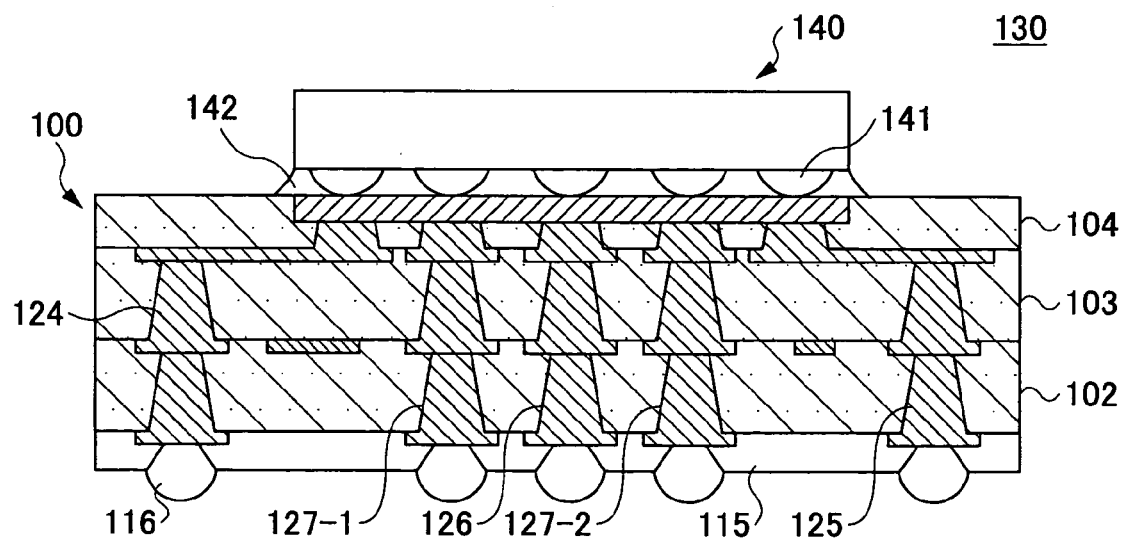
FIG. 5 shows an exemplary structure of a semiconductor device having the semiconductor device substrate shown in FIG. 2.

Referring to FIG. 2, the semiconductor device substrate 100 comprises a substrate body 101 and a capacitor element 20 embedded in the upper surface of the substrate body 101. On the semiconductor device substrate 100, a LSI semiconductor element 140 is mounted as illustrated in FIG. 3 and FIG. 5 described in detail below. A semiconductor device 130 shown in FIG. 5 is often mounted on a print substrate of an electronic device.

It is noted that substantial parts of the present invention are located between the capacitor element 20 and the substrate body 101 as described in detail below.

As shown in FIG. 2, the substrate body 101 is configured as a multi-layer circuit substrate in which resin layers 102, 103 and 104 are layered. Individual conductive patterns 105 on these layers 102, 103 and 104 are electrically connected to each other through a via 106 to pierce the layers 102, 103 and 104. In the interior of the substrate body 101, signal conductive paths 124 and 125, power conductive path 126 and ground conductive paths 127-1 and 127-2 are formed such that the substrate body 101 is pierced in the thickness direction thereof.

The upper surface of the capacitor element 20 is used as a semiconductor element mounting surface 110 for mounting a semiconductor element. As shown in FIG. 3A, signal terminals 44 and 45, a power terminal 46 and ground terminals 47-1 and 47-2 are exposed alongside on the semiconductor element mounting surface 110.

On the bottom surface 115 of the substrate body 101, solder balls 116 are connected to the vias 106. The bottom surface 115 is covered with a solder resist 117.

Referring to FIGS. 3A through 3C, the capacitor element 20 includes a silicon substrate (supporting body) 21, a thin film capacitor part 22, a protective film 23, signal via terminals 24 and 25, a power supply via terminal 26, ground via terminals 27-1 and 27-2, signal terminals 44 and 45, a power supply terminal 46 and ground terminals 47-1 and 47-2. The silicon substrate 21 is formed as a core substrate to have a thickness of less than 50 μm. The thin film capacitor part 22 is formed on the upper surface of the silicon substrate 21. The protective film 23 is formed of an insulation material such that the capacitor part 22 on the upper surface of the silicon substrate 21 is covered. The signal via terminals 24 and 25, the power supply via terminal 26, and the ground via terminals 27-1 and 27-2 are formed to pierce the silicon substrate 21. The signal terminals 44 and 45, the power supply terminal 46 and the ground terminals 47-1 and 47-2 are exposed on the upper surface of the capacitor element 20 such that the signal terminals 44 and 45, the power supply terminal 46 and the ground terminals 47-1 and 47-2 are layered on the signal via terminals 24 and 25, the power supply via terminal 26 and the ground via terminals 27-1 and 27-2, respectively. Instead of the silicon substrate 21, a glass substrate or a ceramic substrate may be used as the supporting body 21. In such a case, it is unnecessary to provide an insulation film (SiO$_2$ film) 51 as described below.

The capacitor part 22 is configured by sandwiching, for example, a Ta (Tantalum) anodization film (dielectric layer) 34 between an lower electrode 32 and an upper electrode 33. The capacitor part 22 on the silicon substrate 21 is protected by the protective film 23. The capacitor part 22 is disposed between the power supply via terminal 26 and the ground via terminals 27-1 and 27-2.

The signal via terminals 24 and 25, the power supply via terminal 26 and the ground via terminals 27-1 and 27-2 are electrically connected to conductive paths in the substrate body 101. The capacitor part 22 is connected between a power supply conductive path 126 and ground conductive paths 127-1 and 127-2. When the semiconductor device 130 is mounted and used on a print substrate of an electronic device, the capacitor part 22 works as a bypass capacitor or a decoupling capacitor to stabilize a power voltage supplied to the semiconductor element 140.

If the capacitor element 20 does not have a semiconductor element, the power supply via terminal 26 and the power supply terminal 46 integrally work as one terminal of the capacitor element 20, and the ground via terminals 27-1 and 27-2 and the ground terminals 47-1 and 47-2 integrally work as the other terminal of the capacitor part 22. Also, since the silicon substrate 21 is configured as a thin substrate having a thickness of less than 50 μm, the capacitor element 20 also has a small thickness. In addition, since the silicon substrate 21 has flexibility, the capacitor element 20 also has flexibility.

Furthermore, a conductive path between the upper surface of the power supply terminal 46 and the capacitor part 22 has a small distance, and a conductive path between the upper surface of the ground terminal 47 and the capacitor part 22 has a small distance. Thus, the parasitic inductance, which is an inductance of a conductive path in these portions, is quite small.

Figure 4:
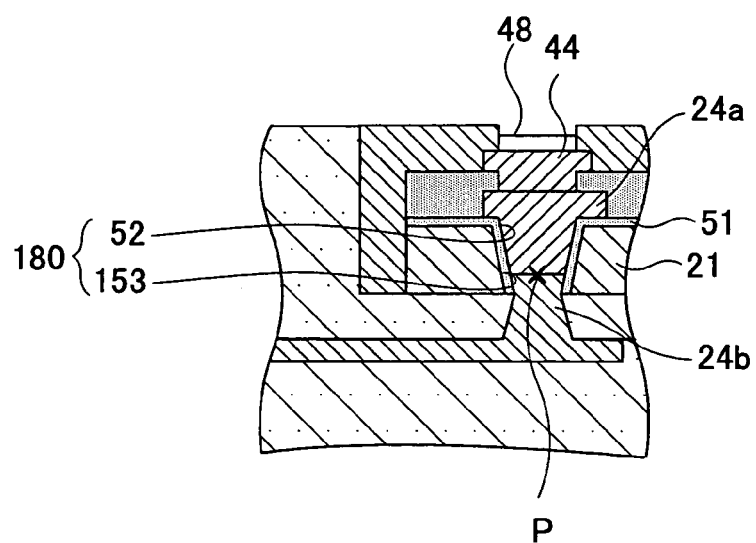
FIG. 4 is an enlarged view of an exemplary structure of a via terminal shown in FIG. 3A.

FIG. 4 is an enlarged view of an exemplary structure of a via terminal shown in FIG. 3A.

Referring to FIG. 4, the signal via terminal 24 is configured by embedding a front surface conductive part 24a and a rear surface conductive part 24b in a via hole 180 in the silicon substrate 21. In this configuration, a tip of the front surface conductive part 24a and a tip of the rear surface conductive part 24b are electrically and mechanically connected to each other at a position P in the via hole 180, that is, at a thickness directional position P within the silicon substrate 21. The rear surface conductive part 24b is a part of a via formed during fabrication of the substrate body 101. The via hole 180 is configured to communicate between a front surface side concave part 52 and a rear surface side concave part 153. The position P is located at the boundary between the front surface side concave part 52 and the rear surface side concave part 153.

Similarly, the other signal via terminal 25, the power supply via terminal 26 and the ground via terminals 27-1 and 27-2 have the same structure as the signal via terminal 24.

In each of the via terminals 24, 25, 26, 27-1 and 27-2, the front surface side conductive part 24a and the rear surface side conductive part 24b are connected at the position P within the via hole 180. As a result, it is possible to prevent penetration of external moisture up to the position P. Compared to a conventional case where these conductive parts 24a and 24b are connected to each other on the rear surface of the silicon substrate 21, the illustrated configuration is highly reliable.

Here, each of the via terminals 24, 25, 26, 27-1 and 27-2 is configured from the conductive part 24a, which is formed during fabrication of the capacitor element 20, and the conductive part 24b, which is formed during fabrication of the substrate body 101.

FIG. 5 shows an exemplary structure of a semiconductor device 130 having the semiconductor device substrate 100 shown in FIG. 2.

Referring to FIG. 5, the semiconductor element 140 is mounted on the semiconductor element mounting surface 110 of the semiconductor device substrate 100 through flip chip bonding. The signal terminals 44 and 45, the power supply terminal 46 and the ground terminals 47-1 and 47-2, which are exposed on the semiconductor element mounting surface 110, are connected to the semiconductor element 140 via bumps 141 provided on the bottom surface of the semiconductor element 140. Also, an under-filling material 142 is provided as illustrated in FIG. 5. The capacitor element 20 is provided under the semiconductor element 140. As a result, it is possible to make the distance of a conductive path between the semiconductor element 140 and the capacitor element 20 extremely small, resulting in an extremely small parasitic inductance in this portion. Thus, even if the semiconductor element 140 operates at a high operating frequency, it is possible to stabilize a power voltage supplied to the semiconductor element 140 without any influence of the parasitic inductance.

An exemplary fabrication method of the semiconductor device substrate 100 is described.

Roughly speaking, the semiconductor device substrate 100 is fabricated as follows. First, the capacitor element 20 is almost formed. Then, the substrate body 101 is formed by covering such an almost formed capacitor element 20A with an insulation layer.

FIGS. 6A through 6D are diagrams to explain fabrication steps of fabricating the semiconductor device substrate 100 shown in FIG. 2.

Figure 6A:
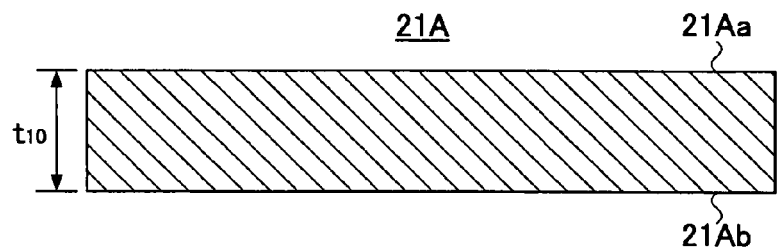
FIGS. 6A through 6D are diagrams to explain fabrication steps of fabricating a semiconductor device substrate according to an embodiment of the present invention.
Figure 6B:
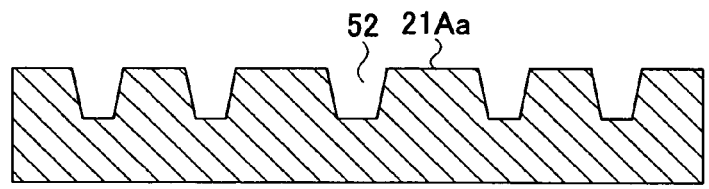
Figure 6C:
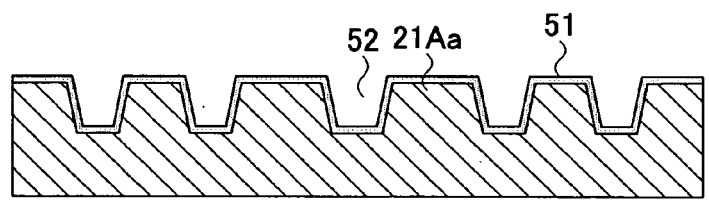
Figure 6D:
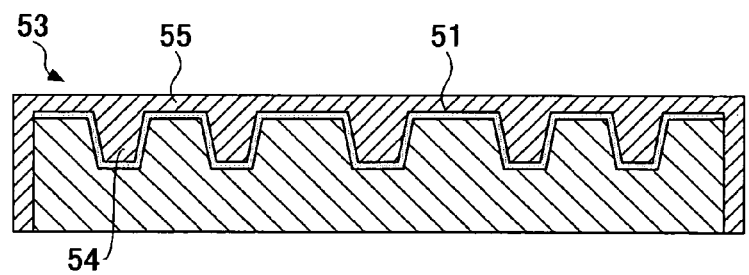

Referring to FIGS. 6A through 6D, a source silicon substrate 21A having a thickness of $t_{10}$ (about 750 μm) is prepared to form an almost formed capacitor element 20A, as illustrated in FIG. 6A. As shown in FIG. 6B, concave parts 52 are formed on one surface 21Aa of the source silicon substrate 21A for the purpose of via terminal formation. Then, an insulation film (SiO$_2$ film) 51 having a thickness ranging between 0.5 μm and 3 μm is formed at least on the surface 21Aa, as illustrated in FIG. 6C, through CVD (Chemical Vapor Deposition), sputtering or thermal oxidation. As shown in FIG. 6D, a Cu coated layer 53 is formed in such a way that the upper and side surfaces of the source silicon substrate 21A are covered and the concave parts 52 are filled by conducting electroless copper plating and electrolytic copper plating on the resulting source silicon surface 21Aa. As a result, it is possible to form a Cu portion 54 to fill the concave parts 52 and a Cu layer 55 to cover the upper surface of the source silicon substrate 21A.

Figure 7A:
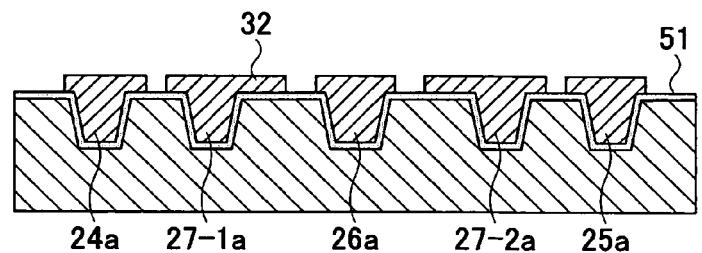
FIGS. 7A through 7C are diagrams to explain subsequent fabrication steps according to an embodiment of the present invention.
Figure 7B:
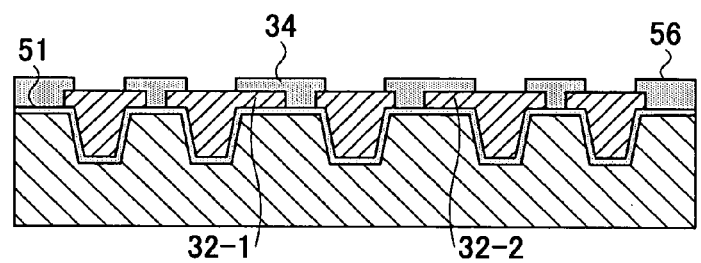
Figure 7C:
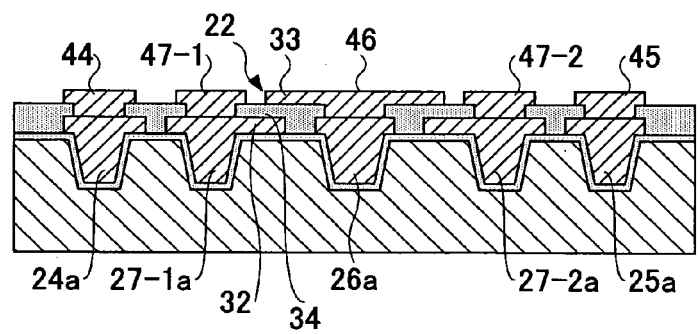

FIGS. 7A through 7C are diagrams to explain subsequent fabrication steps of fabricating the semiconductor device substrate 100.

Referring to FIGS. 7A through 7C, a patterning process is performed on the Cu layer 55 to divide the Cu portion 54 into front surface side conductive parts 24a, 25a, 26a, 27-1a and 27-2a and lower electrodes 32 extending from the front surface side conductive parts 27-1a and 27-2a to the front surface side conductive part 26a, as illustrated in FIG. 7A.

As shown in FIG. 7B, a Ta film is formed by sputtering Ta on the surface 21Aa of the source silicon substrate 21A. Then, the Ta film is anodized to form an oxidized Ta film (dielectric layer) 34.

In order to form an dielectric layer 56, the oxidized Ta film 34 is patterned through etching in such a way that the lower electrodes 32 are covered with the Ta oxidized film 34 and the upper surfaces of the front surface side conductive parts 24a, 25a, 26a, 27-1a and 27-2a are exposed (ref. FIG. 3B). The dielectric layer 34 is a part of the dielectric layer 56.

Then, a Cu coated layer is formed by conducting electroless copper plating and electrolytic copper plating on the upper surfaces 21Aa. In order to form the upper electrode 33, the signal terminals 44 and 45, the power supply terminal 46 and the ground terminals 47-1 and 47-2, the resulting upper surfaces 21Aa are patterned through etching in such a way that the Cu coated layer remains on the upper surface of the dielectric layer 34 and the upper surfaces of the front surface side conductive parts 24a, 25a, 26a, 27-1a and 27-2a. Through formation of the upper electrode 33, it is possible to form the capacitor part 22.

Figure 8A:
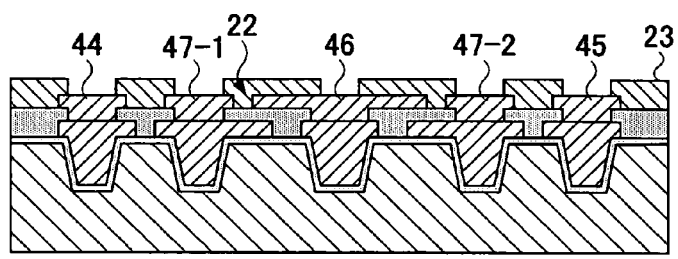
FIGS. 8A through 8C are diagrams to explain subsequent fabrication steps according to an embodiment of the present invention.
Figure 8B:
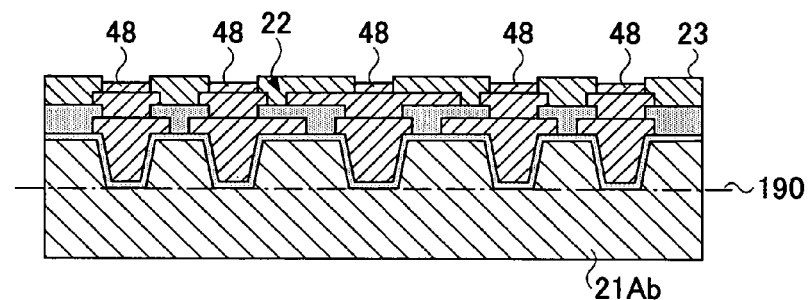
Figure 8C:
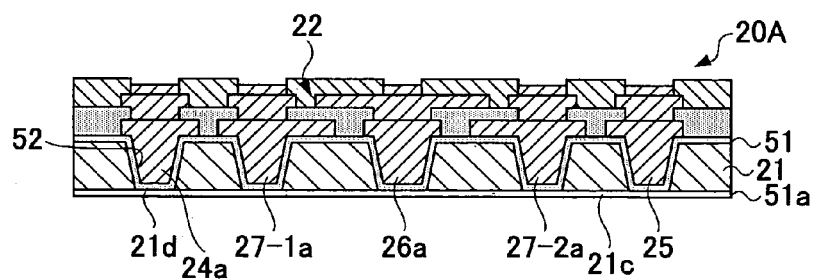

FIGS. 8A through 8C are diagrams to explain subsequent fabrication steps of fabricating the semiconductor device substrate 100.

Referring to FIGS. 8A through 8C, the protective film 23 is formed by providing an epoxy or polyimide insulation film on the resulting upper surfaces 21aA and then exposing the terminals 44, 45, 46, 47-1 and 47-2 through patterning, as illustrated in FIG. 8A.

As shown in FIG. 8B, the exposed upper surfaces of the terminals 44, 45, 46, 47-1 and 47-2 are surface-treated through Ni/Au plating to form Ni/Au plated parts 48.

As shown in FIG. 8C, the rear surface 21Ab of the silicon substrate 21A is back-grinded up to the line 190, that is, until just before the front surface side conductive parts 24a, 25a, 26a, 27-1a and 27-2a are exposed. Then, the capacitor element 20A is formed by providing an insulation film 51a on the grinded rear surface 21Ab in accordance with the same formation method as the above-mentioned insulation film 51. As a result, it is possible to form a surface 21c as the surface of the source silicon substrate 21A opposite to the capacitor element 20A. The front surface side conductive parts 24a, 25a, 26a, 27-1a and 27-2a are protected through coverage with cap parts 21d. The cap parts 21d are formed as the remaining insulation film 51 that has not been grinded. Each cap part 21d has a thickness ranging between 0.5 µm and 3 µm. In this fashion, it is possible to obtain the almost formed capacitor element 20A.

According to the above-mentioned semiconductor device fabrication method, the grindstone does not grind the Cu front surface side conductive parts. As a result, it is possible to prevent generation of Cu powder and clogging of the grindstone. Furthermore, it is possible to prevent scattering of Cu powder and contamination of the working environment for the semiconductor device fabrication.

Here, the insulation film (SiO$_2$ film) 51 is harder than the silicon substrate 21. In the back-grinding of the rear surface 21Ab of the silicon substrate 21A by using a grindstone, when the grindstone reaches the insulation film 51 located in the bottom of the concave part 52, the stress to the grindstone increases. Thus, when such a stress increase to the grindstone is detected, it is possible to halt the back-grinding at appropriate timing when the insulation film 51 is exposed.

FIGS. 9A through 9D are diagrams to explain subsequent fabrication steps of fabricating the semiconductor device substrate 100.

Figure 9A:
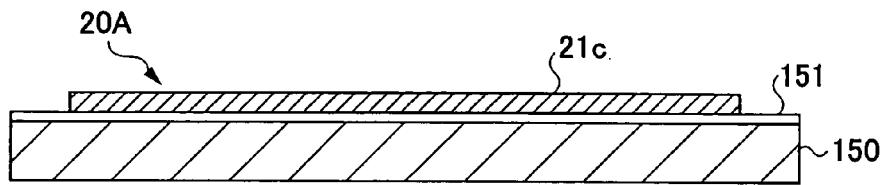
FIGS. 9A through 9D are diagrams to explain subsequent fabrication steps according to an embodiment of the present invention.
Figure 9B:
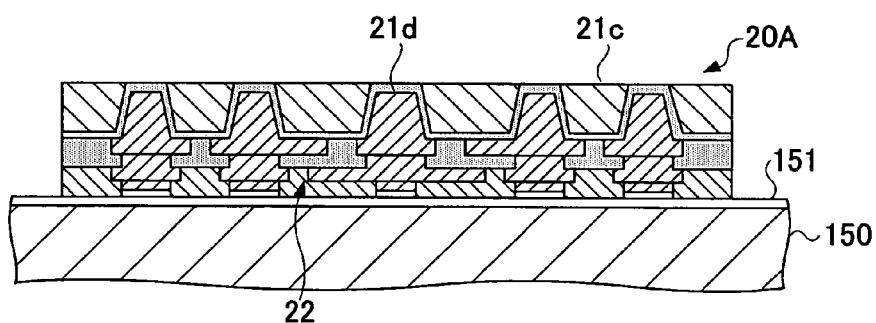

Referring to FIGS. 9A through 9D, the almost formed capacitor element 20A shown in FIG. 8C is turned over and mounted on a thin resin film 151, which is formed of resin such as polyimide, on the upper surface of a metal plate 150, which is formed of metal such as Cu, as illustrated in FIGS. 9A and 9B (detailed view of FIG. 9A).

Figure 9C:
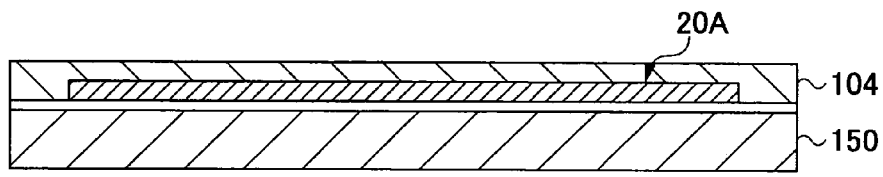
Figure 9D:
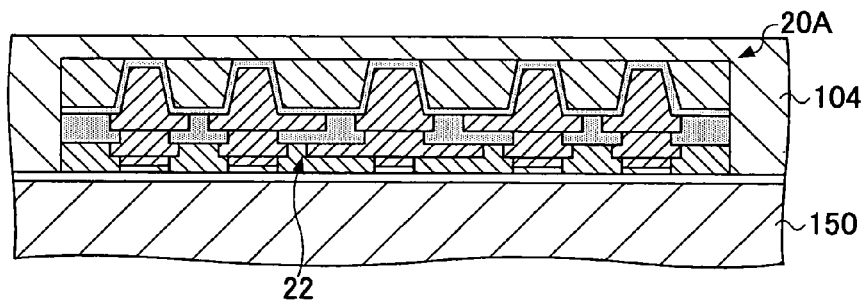

Then, a resin layer 104, which is formed of a material such as epoxy, is laminated to fully cover the capacitor element 20A, as illustrated in FIGS. 9C and 9D (detailed view of FIG. 9C).

FIGS. 10A through 10D are diagrams to explain subsequent fabrication steps of fabricating the semiconductor device substrate 100.

Figure 10A:
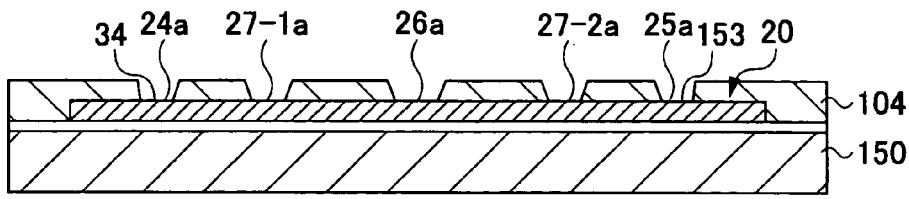
FIGS. 10A through 10D are diagrams to explain subsequent fabrication steps according to an embodiment of the present invention.
Figure 10B:
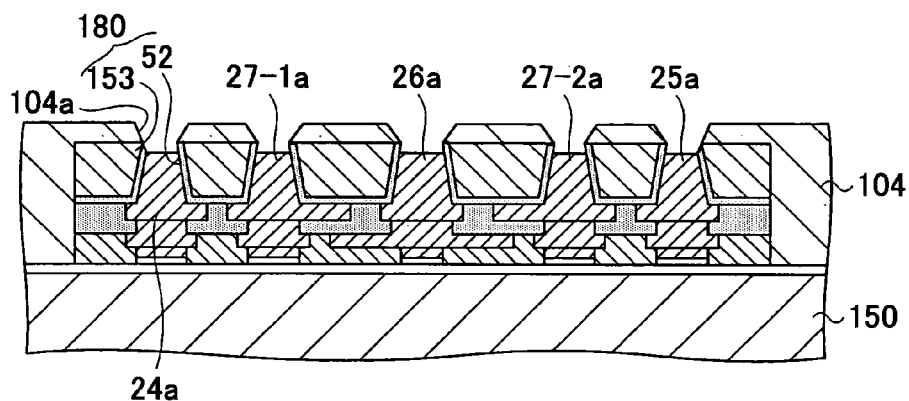

Referring to FIGS. 10A through 10D, via holes 104a are formed at positions corresponding to the front surface side conductive parts 24a, 25a, 26a, 27-1a and 27-2a in the resin layer 104 through laser processing or etching, as illustrated in FIGS. 10A and 10B (detailed view of FIG. 10A). Furthermore, the concave parts 153 are formed in the surface 21c of the silicon substrate 21 opposite to the capacitor element 20A by removing the cap part 21d so as to form the front surface side conductive parts 24a, 25a, 26a, 27-1a and 27-2a. The concave parts 153 are joined to the above-mentioned concave parts 52, and the tips of the front surface side conductive parts 24a, 25a, 26a, 27-1a and 27-2a are exposed on the bottom surfaces of the concave parts 153. Also, vias 180 to pierce the silicon substrate 21 are formed by joining the concave parts 153 and 52. Since the cap parts 21d are formed as the remaining insulation film 51 having a thickness of 0.5 µm through 3 µm, it is possible to easily form the concave parts 153.

Figure 10C:
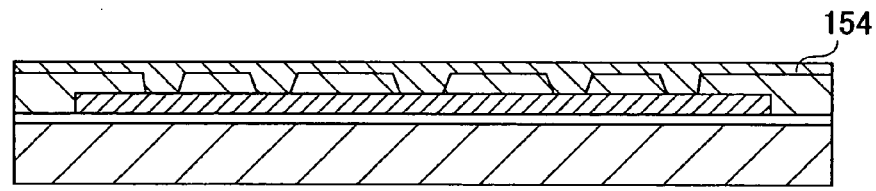
Figure 10D:
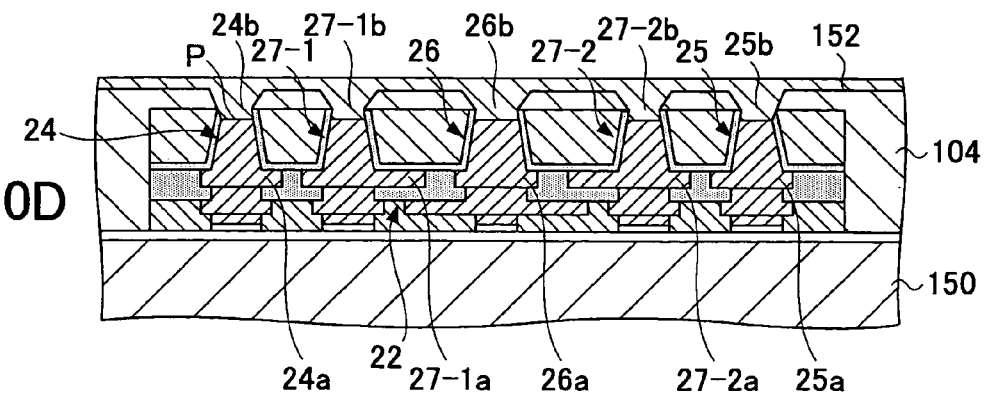

Then, a metal layer 154 is formed on the whole surface of the resin layer 104 through electroless copper plating and electrolytic copper plating, as illustrated in FIGS. 10C and 10D (detailed view of FIG. 10C). The metal layer 154 is formed to fill the via holes 104a and the concave parts 153.

FIGS. 11A through 11D are diagrams to explain subsequent fabrication steps of fabricating the semiconductor device substrate 100.

Figure 11A:
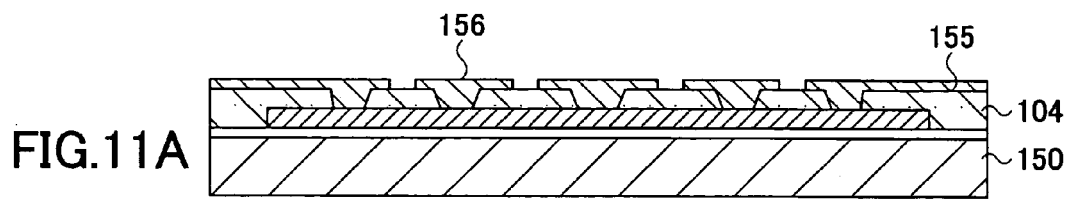
FIGS. 11A through 11D are diagrams to explain subsequent fabrication steps according to an embodiment of the present invention.
Figure 11B:
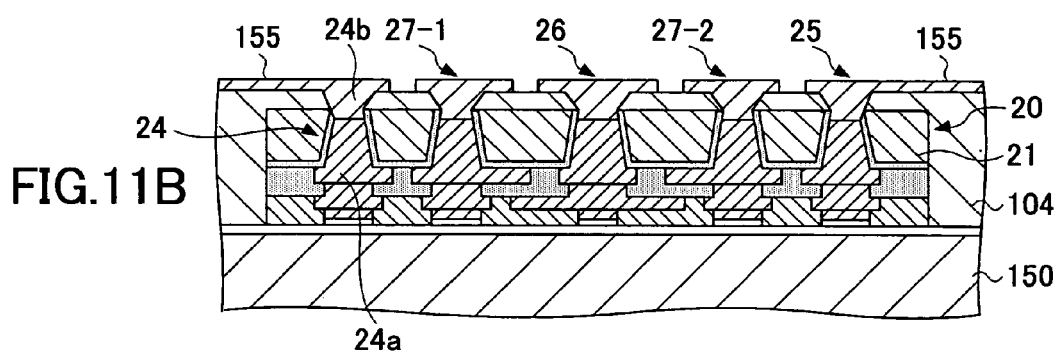

Referring to FIGS. 11A through 11D, the metal layer 154 is patterned through photolithography to form a conductive pattern 155 and rear surface side conductive parts 24b, 25b, 26b, 27-1b and 27-2b, as illustrated in FIGS. 11A and 11B (detailed view of FIG. 11A). In order to form via terminals 24, 25, 26, 27-1 and 27-2, the rear surface side conductive parts 24b, 25b, 26b, 27-1b and 27-2b are electrically and mechanically connected to the front surface side conductive parts 24a, 25a, 26a, 27-1a and 27-2a, respectively, at the above-mentioned position P in the vias 180, that is, at the thickness directional position P in the silicon substrate 21.

Figure 11C:
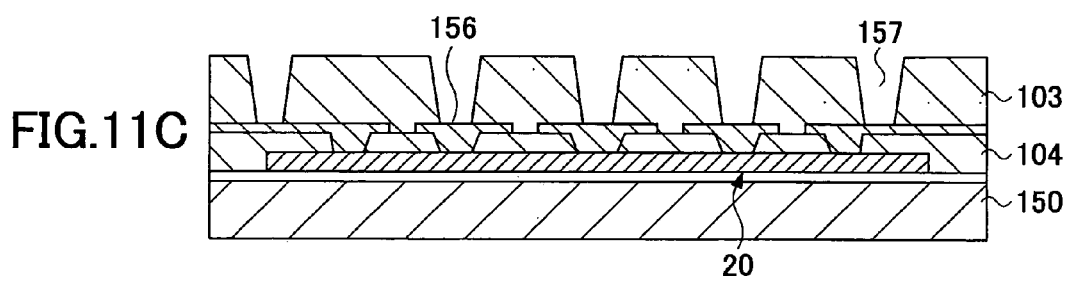
Figure 11D:
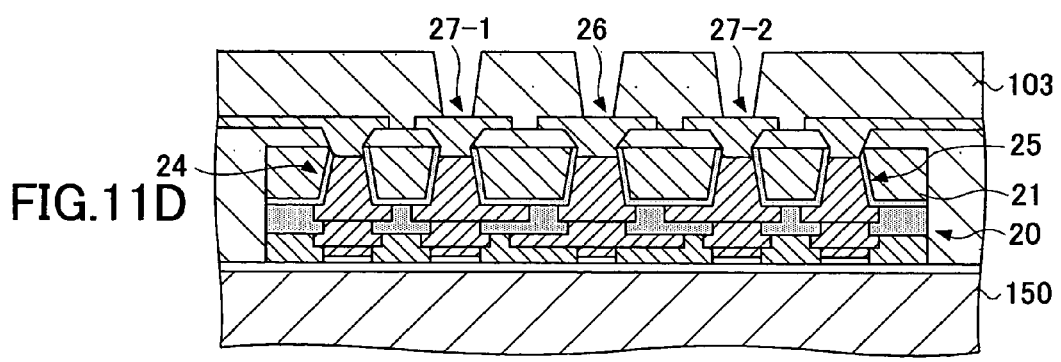

Then, concave parts 157 are formed for the purpose of via formation by laminating the resin layer 103 on the conductive pattern 155 and conducting laser treatment or etching on the resin layer 103. As a result, it is possible to expose the via terminals 26, 27-1 and 27-2 on the bottom surfaces of the concave parts 157, as illustrated in FIGS. 11C and 11D (detailed view of FIG. 11C).

Figure 12A:
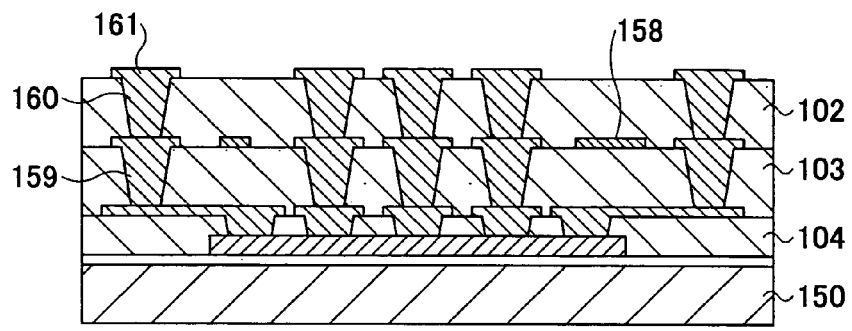
FIGS. 12A through 12C are diagrams to explain subsequent fabrication steps according to an embodiment of the present invention.
Figure 12B:
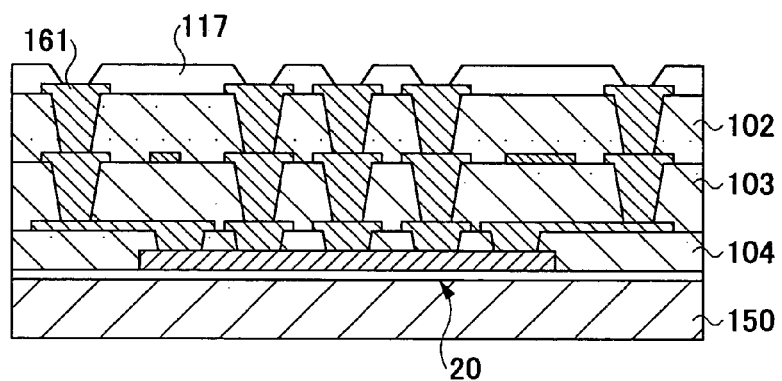
Figure 12C:
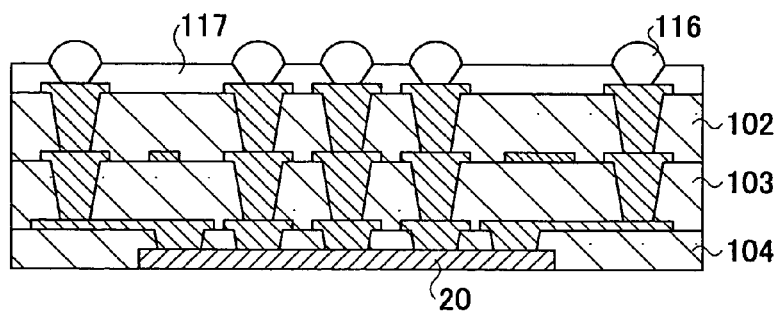

FIGS. 12A through 12C are diagrams to explain subsequent fabrication steps of fabricating the semiconductor device substrate 100.

Referring to FIGS. 12A through 12C, similarly to the above-mentioned process, a metal layer is formed on the whole surface of the resin layer 103, and a conductive pattern 158 and vias 159 are formed by patterning the coated metal layer, as illustrated in FIG. 12A. Then, a resin layer 102 is laminated, and concave parts are formed in the resulting resin layer 102 for the purpose of via formation.

Furthermore, a metal layer is formed on the whole surface of the resin layer 102, and the metal layer is patterned to form vias 160 and pads 161.

Then, a solder resist 117 is coated on the whole surface of the resin layer 102 except for the portion corresponding to the pads 161, as illustrated in FIG. 12B.

Finally, the metal plate 150 is completely removed through etching, and the thin resin layer 151 is removed through dry-etching, as illustrated in FIG. 12C.

The etching conducted on the metal plate 150 proceeds up to the thin resin layer 151, and when the etching reaches the thin resin layer 151, the etching halts without excessive etching progression. Also, the solder balls 116 are joined to the pads 161 by reflow soldering under a status where the solder balls 116 are located at the concave parts on the solder resist 117.

Figure 13:
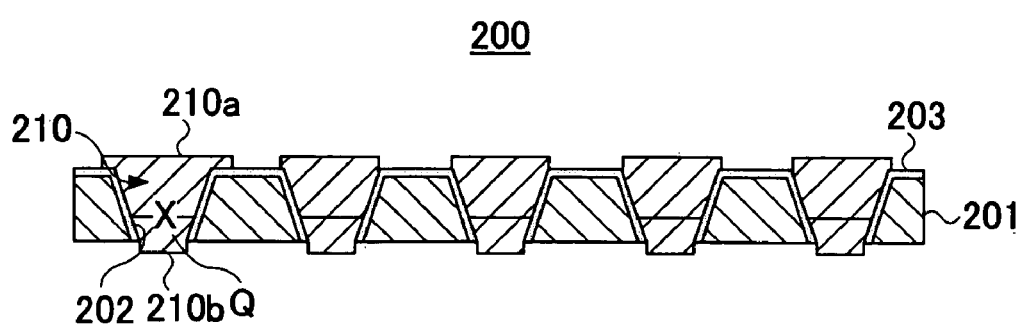
FIG. 13 is a cross-sectional view of an interposer according another embodiment of the present invention.

FIG. 13 is a cross-sectional view of an exemplary interposer according to another embodiment of the present invention.

Referring to FIG. 13, an interposer 200 includes a plurality of via terminals 202 on a silicon core substrate 201. Each of the via terminals 202 is configured by embedding a front surface side conductive part 210a and a rear surface side conductive part 210b in the via hole 202 in the silicon core substrate 201 and electrically and mechanically connecting tips of the front surface side conductive part 210a and the rear surface side conductive part 210b at a position Q within the via hole 202, that is, at a thickness directional position Q within the silicon core substrate 201. Here, an insulation film 203 is formed on the inner surface of the via hole 202.

The present invention is not limited to the specifically disclosed embodiments, and variations and modifications may be made without departing from the scope of the present invention.

The present application is based on Japanese priority application No. 2003-058999 filed Mar. 5, 2003, the entire contents of which are hereby incorporated by reference.

What is claimed is:

1. A method of fabricating a substrate having a via terminal from a source substrate by piercing a conductive part through a core substrate of the substrate, the method comprising the steps of:
   forming a concave part on a front surface of a source substrate thicker than the core substrate;
   forming a front surface side conductive part by filling the concave part in the front surface with a conductor;
   forming the core substrate by grinding the source substrate from a rear surface of the source substrate up to a position immediately before the front surface side conductive part is exposed such that a tip of the front surface side conductive part is covered with a portion of the core substrate;
   exposing the tip of the front surface side conductive part by forming a concave part in a rear surface of the core substrate;
   forming a rear surface side conductive part by filling the concave part in the rear surface with a conductor; and electrically and mechanically connecting the front surface side conductive part with the rear surface side conductive part to form the via terminal.

2. The method as claimed in claim 1, further comprising the step of forming an insulation film on a surface of the source substrate including an inner surface of the concave part on the front surface of the source substrate after the step of forming the concave part in the front surface of the source substrate thicker than the core substrate before the step of forming the front surface side conductive part by filling the concave part on the front surface with the conductor.

3. The method as claimed in claim 1, wherein the source substrate is one of a silicon substrate, a glass substrate and a ceramic substrate.

4. A method of fabricating a semiconductor device substrate for mounting a semiconductor element wherein the semiconductor device substrate includes at least one external connection terminal and a capacitor element, the at least one external connection terminal is provided on a rear surface of the semiconductor device substrate, and the capacitor element includes a core substrate and a capacitor part formed on a front surface of the core substrate by sandwiching an electrode between dielectric layers, the method comprising the steps of:
   forming a capacitor element in such a way that a front surface side concave part in a front surface of the core substrate is filled with a conductor and the core substrate is grinded from a rear surface thereof up to a position where the front surface side conductive part is not exposed;
   turning over the formed capacitor element and mounting the resulting capacitor element on the semiconductor device substrate;
   forming an insulation layer on a front surface of the mounted capacitor element;
   forming a concave part to pierce through the insulation layer toward the front surface side concave part by grinding the core substrate from the rear surface thereof;
   forming a rear surface side conductive part by filling the formed concave part in the rear surface of the core substrate with a conductor and electrically and mechanically connecting the rear surface side conductive part with the front surface side conductive part at a thickness directional position of the core substrate in order to form a via terminal; and
   forming an insulation layer on an upper surface of the resulting core substrate, forming a hole to pierce the insulation layer, filling the hole with a conductor, and forming a conductive path electrically and mechanically connected to the via terminal.

5. The method as claimed in claim 4, wherein the step of forming the capacitor element forms an insulation film on an inner surface of the front surface side concave part and fills the front surface side concave part with a conductor.

6. The method as claimed in claim 4, wherein the core substrate is one of a silicon substrate, a glass substrate and a ceramic substrate.

* * * * *